US005617790A

United States Patent [19]
Chmielnik

[11] Patent Number: 5,617,790
[45] Date of Patent: Apr. 8, 1997

[54] APPARATUS FOR PRODUCING FLEXOGRAPHIC PRINTING PLATES

[75] Inventor: Reinhold Chmielnik, Bolton, Canada

[73] Assignee: P.R. Graphics Limited, Mississauga, Canada

[21] Appl. No.: 456,074

[22] Filed: May 31, 1995

[51] Int. Cl.[6] ................................................ B41F 27/06
[52] U.S. Cl. ................................................ 101/389.1
[58] Field of Search .......................... 101/415.1, 378, 101/401.1, 389.1, 395; 354/410, 413, 126; 269/21; 248/362; 430/300, 306, 200, 320, 301

[56] References Cited

U.S. PATENT DOCUMENTS 4,056,057  11/1977  Smith .................................. 101/389.1
4,262,594   4/1981  Landsman .......................... 101/389.1

Primary Examiner—J. Reed Fisher
Attorney, Agent, or Firm—Sim & McBurney

[57] ABSTRACT

A multicolor half-tone image of an original object is formed on a recipient printing surface, such as a preformed plastic container, by printing such image in a series of individual one-color images from flexographic printing plates directly onto the recipient surface, so as to provide thereon overlying one-color half-tone images.

3 Claims, 3 Drawing Sheets

APPARATUS FOR PRODUCING FLEXOGRAPHIC PRINTING PLATES

FIELD OF INVENTION

The present invention is directed to a printing process which provides a multicolor representation of an original object on a recipient surface, which may be planar, such as a paper or paperboard sheet, or curved surface, such as a preformed container. The present invention also is directed to a printing plate exposure device for utilization in manufacturing printing plates for such procedures.

BACKGROUND TO THE INVENTION

The printing of images on curved surfaces, such as those of preformed plastic containers, has generally involved the use of offset printing where multiple color printings are required. These are formed by a plurality of printing stations arranged around the printing blanket to print separate one color images of ink thereon for transfer to the container. In my prior U.S. Pat. No. 4,774,885, there is described the provision of a reproduction of a photograph on a preformed container using such offset printing.

Such offset printing involves the use of very thin metal lithographic printing plates which possess very little or no relief which leads to very little or no distortion of the image when printed on a curved surface.

Flexographic printing has become a popular printing procedure in recent years, in which a flexible printing plate, for example, CYREL® photopolymer plates, having a relief image formed thereon, is used to print a recipient surface.

SUMMARY OF INVENTION

In accordance with the present invention, there is provided a novel printing process which permits a full multicolor half-tone image of an object to be printed on a recipient surface by flexography. In the present invention, a plurality of flexographic printing plates each bearing a one-color half-tone relief image of the original object is formed and a plurality of individual one-color half-tone images is successively printed directly from such printing plates onto a recipient surface to provide a full multicolor half-tone image corresponding in appearance to the original object and comprising a multitude of closely-spaced single-color dots, which are separate, overlap or in registry as determined by the image.

The present invention also includes a procedure and device for forming the flexographic one-color image printing plates. Such procedure and device employs a mounting cylinder of the same diameter as the printing cylinder from which the image is to be printed and an array of elongate ultraviolet light exposure lamps arranged around the mounting cylinder in a cylindrical array coaxially arranged with respect to the mounting cylinder, for exposure of a printing plate mounted on the mounting cylinder to ultraviolet radiation through a one-color photographic reproduction of multicolor original object with the printing plate held to the mounting cylinder by vacuum.

GENERAL DESCRIPTION OF INVENTION

Figure 1:
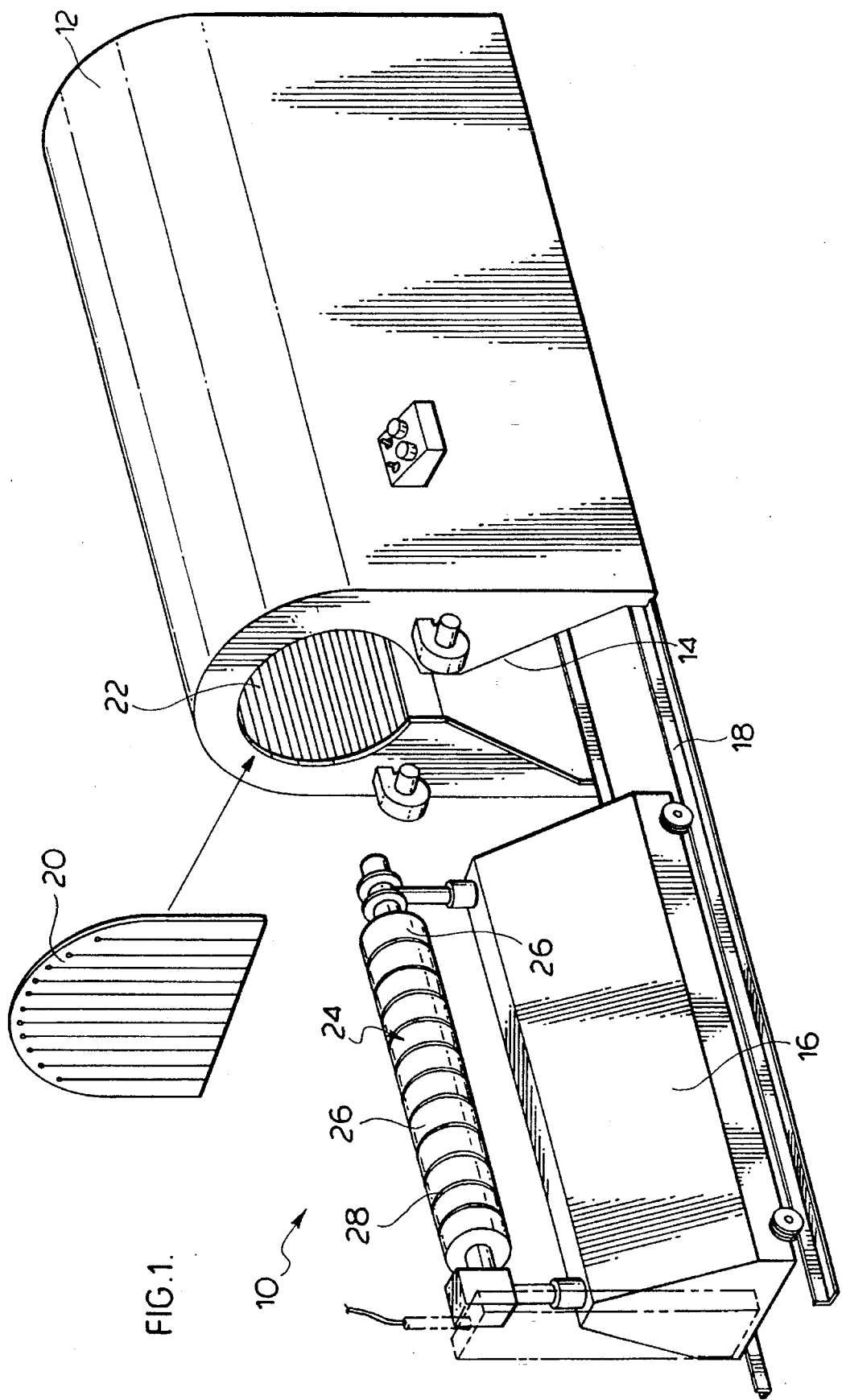
FIG. 1 is a perspective view of a printing plate exposure device constructed in accordance with one embodiment of the invention.
Figure 2:
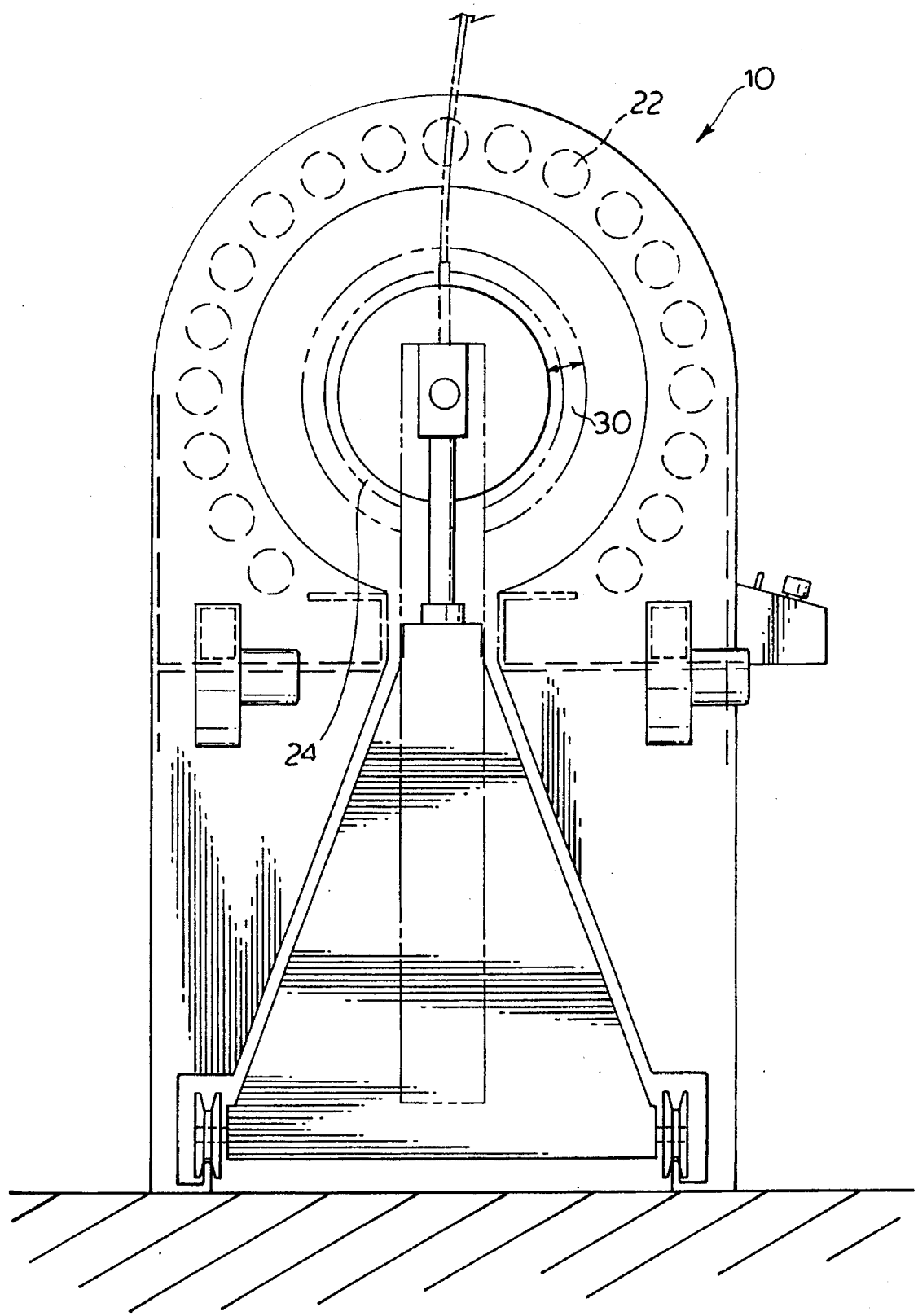
FIG. 2 is an end view of the device of FIG. 1.
Figure 3:
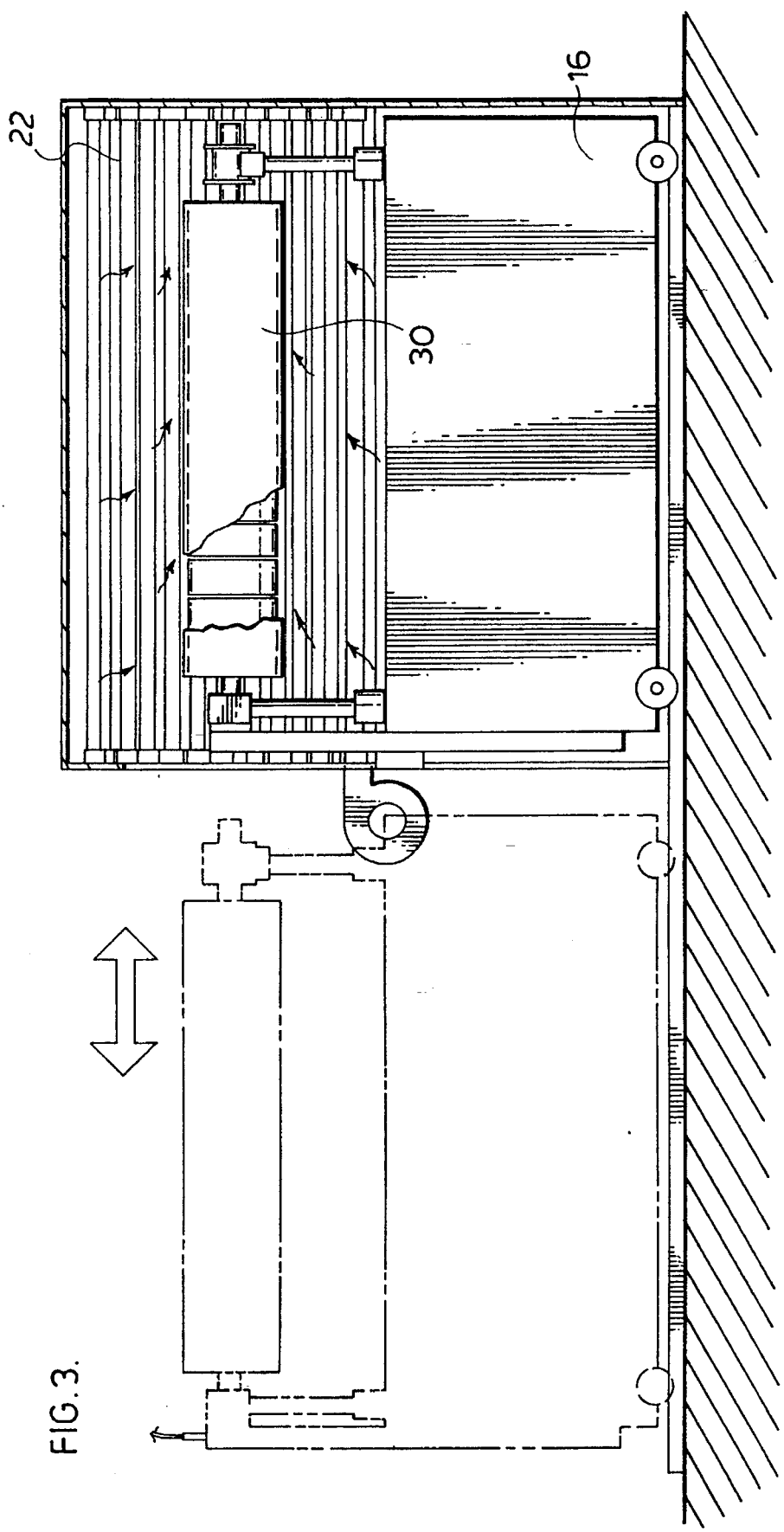
FIG. 3 is a side-elevational, part-sectional view of the device of FIG. 1.

The first step in the formation of a multicolor half-tone image, usually a four-color image of the colors yellow, red (magenta), blue (cyan) and black, although additional colors may be used, involves color separation of an original image into separate half-tone one-color images. Such color separation is conventionally carried out in conventional gravure printing and involves photographing the original object through a finely-lined screen to provide a picture whose lights, shadows and colors are comprised of minute dots of a single color.

The next step of the procedure of the invention involves forming a plurality of separate flexographic printing plates each bearing a one-color half-tone image of the original object from each of the single color images. When the image is to be printed onto a curved surface, such as a preformed container, it is necessary to form such one-color, half-tone images on the flexographic printing plates while the printing plates are held in a curved condition having a radius of curvature corresponding to that of the curved surface onto which the image is to be printed. This arrangement permits the printing of undistorted images on the curved recipient surface with proper registry of the single color dots, particularly at a high image resolution.

Such curved condition may be achieved by mounting the printing plate on a cylinder having a diameter corresponding to that of the preformed article, such as a plastic container, onto which the image is to be printed, but allowing for the thickness of the printing plate. A device for carrying out such procedure is provided herein and is described in more detail below. Since a relief image is formed on the flexographic printing plate, there is a considerable tendency to form a distorted image when printing onto a curved surface, particularly at the high degree of resolution required for faithful reproduction of a photographic image.

The flexographic plate with the one-color half-tone image mounted, in any convenient manner, on the mounting cylinder then is exposed to UV light and the photopolymer is developed to provide a relief image in the plate corresponding to the one-color half-tone image photograph. This procedure then is repeated for each one-color image to provide a plurality of developed flexographic printing plates corresponding to the individual one-color images.

Additionally, it is preferred to form the individual one-color image printing plates in a curved condition corresponding in diameter to the diameter of the printing cylinder to be used to print the image, so as to avoid any distortion arising from the flexible nature of the printing plate, which tends to stretch the image and cause relief dots to hollow out in the middle, resulting in a color imbalance in the printed image. The photographic image may be printed onto a planar recipient surface, such as a carton blank.

The individual half-tone flexographic printing plates are each mounted on a printing cylinder which is arranged to provide successive one-color printings in registry directly from the flexographic printing plate onto the surface on which the image is formed so as to provide a multi-color image thereon corresponding to the original object. Such surface may comprise a preformed article, such as a plastic container, or a planar surface. For printing onto curved surfaces, such as plastic container, the flexographic printing plates are held in the same curved condition as that in which the one-color half-tone image was formed therein, i.e. a 1:1 diametric relationship of the cylinder to the curved surface, while allowing for the thickness of the flexographic printing plate mounted thereon.

The individual colors are provided by vegetable, water-based printing inks, usually in the primary colors of yellow, red (magenta), blue (cyan) and black, although additional colors may be employed. It is preferred to print these colors from the individual printing plates onto the recipient surface in the sequence of yellow, red, blue and black, although other sequences can be employed.

In general, the individual one-color images are printed from individual printing stations. Such stations may comprise a source of printing ink and means for applying printing ink to the relief image of the flexographic printing plate mounted on a printing cylinder. Provision may be made for drying the individual one-color image printed directly from the flexographic printing plate directly onto the recipient surface between printing stations, as necessary, the recipient surface is maintained in registry with the individual printing stations to ensure the provision of an undistorted image.

In the present invention, a four or more color half-tone image is formed directly on the recipient surface. The individual one-color half-tone images printed sequentially and in registry on the recipient surface provide individual dots of individual colors standing alone, overlapping or registering with individual dots of the other individual colors, as dictated by the color separation of the original photograph. At locations of dot overlap or registry, the colors blend to provide a hue corresponding to the blend. In this way, a four-color half-tone image, which is a reproduction of the originally photographed object, is obtained on the recipient surface.

Once the image is printed on the preformed surface, the image is dried thereon, for example, by ambient air drying or hot air drying, as desired, and may be protected, such as by a transparent lacquer layer, if desired.

DESCRIPTION OF PREFERRED EMBODIMENT

Referring to the drawings, an exposure device 10 for flexographic printing plates comprises an enclosure 12 having an opening 14 at one end for permitting a trolley 16 mounted on rails 18 to enter and leave the enclosure 12. A flexible strip screen 20 is provided over the upper part of the opening 14.

Located internally of the housing, are a plurality of elongate ultraviolet lamps 22 to enable a flexographic printing plate borne by the trolley 16 to be exposed to ultraviolet radiation, as discussed below. The lamps 22 are arranged, when seen in end view, in a part-circular array of the same centre of curvature as a mount 24 on the trolley 16.

The mount 24 consists of a plurality of cylindrical segments 26 separated by a small gap 28 through which vacuum is applied from the interior of the mount for mounting a printing plate thereon for exposure to ultraviolet radiation. For the manufacture of a flexographic printing plate, an unexposed printing plate 30 has a one-color image of an original object to be printed on a recipient surface attached thereto and the printing plate 30 is mounted to the mounter 24 with vacuum holding the printing plate 30 to the surface of the mounter 24.

The trolley 16 then is moved into the housing 12 and the printing plate 30 exposed to ultraviolet radiation from the lamps 22. Following such exposure, the trolley 16 is withdrawn from the enclosure and the printing plate 30 removed for development of the relief image on the printing plate 30 by conventional flexographic printing plate development.

The mounter 24 has a diameter corresponding to the diameter of the printing cylinder on which the printing plate 30 is to be mounted for printing the intended recipient surface. A series of mounters 24 of differing diameters corresponding to the standard differing diameters of printing cylinders may be provided, so that the correct diameter of mounter can be used for the specific printing plate.

The procedure of exposure and printing plate development is repeated for each one-color image of the original object so as to provide a plurality of flexographic printing plates, which then may be used to print the full-color image of the original object on the desired recipient surface from printing cylinders having the same diameter as the mounter 24.

SUMMARY OF DISCLOSURE

In summary of this disclosure, the present invention provides a novel printing procedure which enables a multiple-color half-tone image printing to be made from flexographic printing plates directly onto a recipient surface, particularly the curved surface of a preformed container, to provide thereon a faithful reproduction of a three-dimensional object on the surface. Modifications are possible within the scope of this invention.

What I claim is:

1. Apparatus for producing flexographic one-color image printing plates, which requires:

a housing having mounted therein and arranged in a part-circular array a plurality of elongate ultra-violet lamps for exposing a flexographic printing plate to ultra-violet light, said housing being closed at one longitudinal end and open at the other longitudinal end, a trolley movable into and out of the housing through the open end thereof, and cylindrical flexographic printing plate mounting means comprising a plurality of segments separated one from another to define a gap between each adjacent segment, said mounting means having an inner chamber communicating with each of said gaps and also communicating with a source of vacuum to apply vacuum through said gap to hold a flexographic printing plate to the outer surface of said mounting means for exposure to the said ultraviolet lamps when in said housing.

2. The apparatus of claim 1 wherein said trolley is mounted on a track for reciprocal movement of said trolley into and out of said housing.

3. The apparatus of claim 2 wherein a curtain is provided at the open end of said housing.

\* \* \* \* \*